United States Patent [19]

Spaeth et al.

[11] 4,158,133

[45] Jun. 12, 1979

[54] FILTERS FOR PHOTO-DETECTORS

[75] Inventors: Werner Spaeth, Holzkirchen; Laszlo Bacs, Neuried, both of Fed. Rep. of Germany

[73] Assignee: Siemens Aktiengesellschaft, Berlin & Munich, Fed. Rep. of Germany

[21] Appl. No.: 826,394

[22] Filed: Aug. 16, 1977

[30] Foreign Application Priority Data

Aug. 20, 1976 [DE] Fed. Rep. of Germany ....... 2637616

[51] Int. Cl.² .............................................. H01J 39/12
[52] U.S. Cl. .................................. 250/211 J; 350/166
[58] Field of Search ............................ 250/211 J, 226; 350/166

[56] References Cited

U.S. PATENT DOCUMENTS

| | | | |
|---|---|---|---|
| 3,076,861 | 2/1963 | Samulon et al. | 250/226 |
| 3,247,392 | 4/1966 | Thelen | 250/226 |
| 3,528,726 | 9/1970 | Austin | 350/166 |
| 3,649,359 | 3/1972 | Apfel et al. | 350/166 X |
| 3,743,847 | 7/1973 | Boland | 250/226 X |
| 3,781,090 | 12/1973 | Sumita | 350/166 X |
| 3,929,398 | 12/1975 | Bates | 250/226 X |
| 3,949,463 | 4/1976 | Lindmayer et al. | 29/572 |
| 3,996,461 | 12/1976 | Sulzbach et al. | 250/211 J |

*Primary Examiner*—James B. Mullins
*Attorney, Agent, or Firm*—Hill, Van Santen, Steadman, Chiara & Simpson

[57] ABSTRACT

Optical filters are directly mounted on the surface of photo-detectors. The filters have maximum radiation permeability for the operating range of the photo-detector. For that region of the spectrum which lies outside of the operating range, the filters are of maximum impermeability and considerably decrease interfering currents resulting from the incidence of foreign light. The direct mounting of the filters on the detector surface effects not only technical but also economical advantages.

13 Claims, 5 Drawing Figures

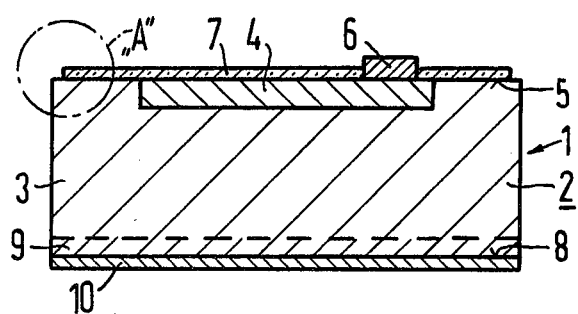
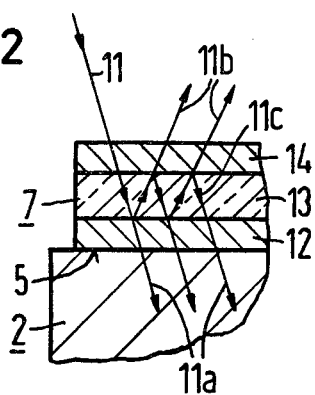
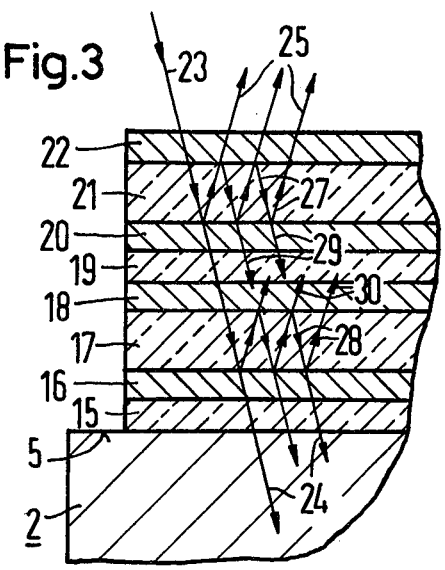
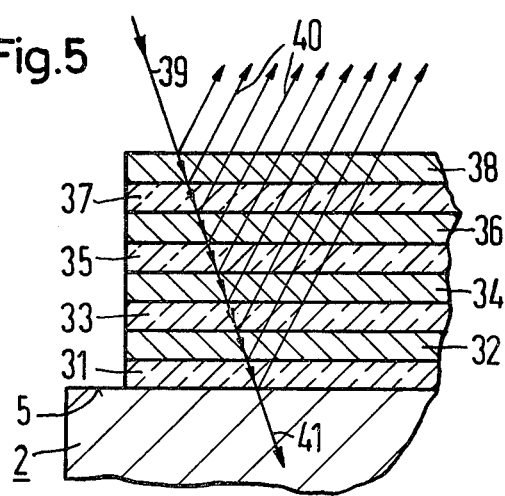

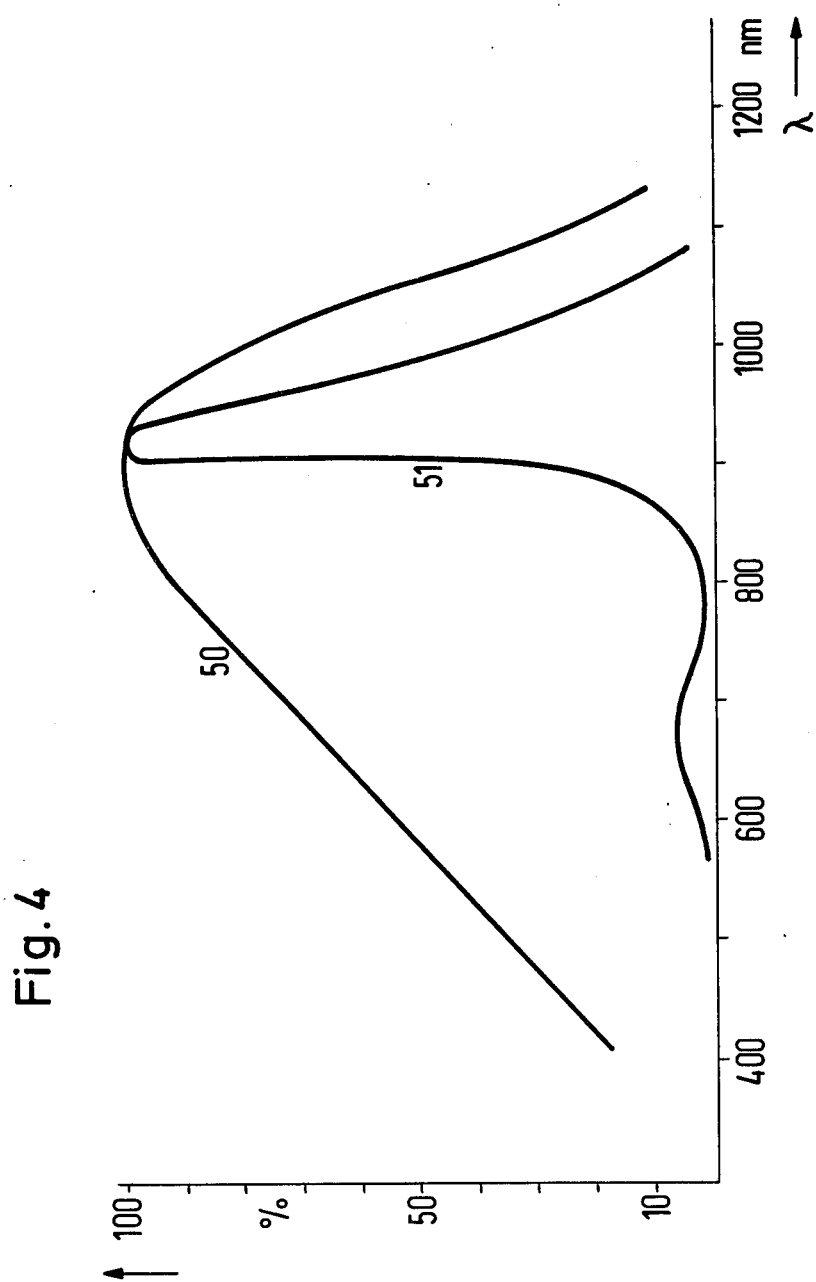

FILTERS FOR PHOTO-DETECTORS

BACKGROUND OF THE INVENTION

1. Field of the Invention

The invention relates to filters for photo-detectors, where the filters are permeable to that spectral range of electromagnetic radiation which lies in the operating range of the associated photodetector, and are largely impermeable to other spectral ranges.

2. Description of the Prior Art

Semiconductor detectors generally exhibit a wide sensitivity range, of which, however, frequently only a narrow spectral range is employed as an operating range. The sensitivity range of semiconductor detectors, which lies outside the operating range of the detector, gives rise to undesired interference currents under the influence of foreign light. Therefore, in order to reduce these interference currents, it is desirable to provide semiconductor detectors with optical filters which are impermeable to electromagnetic radiation in the entire sensitivity range of the detectors, excluding their operating range. A measure of this type could be readily effected employing commercially available optical filters. However, in a mass production of optical semiconductor components, important factors oppose the use of commercially available filters. As is known, optical filters are expensive which would lead to a considerable increase in the cost of the end product. The costs of the filter assembly would also constitute another, not inconsequential increase in the cost for the end product. Thus solely for economical considerations, it is not advisable to equip photo-detectors with commercially available filters.

The use of pre-manufactured, optical filters in photo-detectors also restricts the technical possibilities for use, since only a specific assortment of filters having specific technical characteristic parameters and specific shapes and sizes are available. Any deviation from the predetermined characteristic data and the predetermined dimensions would at least increase the costs of, if not render impossible, the use of pre-manufactured filters.

SUMMARY OF THE INVENTION

Therefore an object of the present invention is to provide filters for photo-detectors, the technical parameters of which can be matched simply and with low cost to the requirements of the photo-detector and which, even for mass production of such photo-detectors, results in a practical cost.

This object is realized in accordance with the invention by providing filters consisting of one or more layers which are directly applied to the detector surface.

Filters arranged directly on the detector surface have the advantage, in comparison to filters which are not directly applied to the surface, that generally speaking the reflection losses are lower and laterally incoming interference light is kept away from the detector. Furthermore, filters not arranged directly on the detector surface involve a considerably higher cost outlay for the acquisition and assembly of the filters. In particular, in the case of mass produced photo-detectors, this extra cost is extremely high.

Furthermore, the design possibilities when using filter layers arranged directly on the detector surface are extremely great, due to the fact that the filter layers can be easily adapted to specific detector characteristic data.

It is novel to employ thin film filters as light filters with photo-detectors.

A further development of the invention is that the thin film filters are provided as a multiple layer sequence with alternatingly high and low indices of refraction.

It is also a novel feature that the optical layer thickness of at least one layer of a multiple layer sequence amounts to $\lambda/4$ or a multiple of $\lambda/4$, where $\lambda$ is the most heavily concentrated wavelength of the spectral group of beams which passes through the filter.

With the aid of this technique it is possible to produce thin film filters which transmit a relatively narrow band of optical radiation.

It is also advantageous that the filters consist of Perot-Fabry interference filters. The function of a Perot-Fabry interference filter is to allow a light beam having a specific most heavily concentrated wavelength $\lambda$ through the filter with a high intensity, whereas it allows spectral neighboring ranges to pass through with only a low intensity when metal reflectors are used; and when dielectric reflectors are used the adjacent ranges are only let through over smaller spectral ranges. The band width of the transmitted light beam is dependent upon the indices of refraction of the filter materials. The object of a detector filter process is to adapt the transmitted light beam to the operating range of the detector.

It is also novel that the filters are double or multiple Perot-Fabry filters.

In order to optimize the function of Perot-Fabry filters, double or multiple Perot-Fabry filters may be used.

A further development of the invention is that the layers of the filter arranged on the detector surface consist of at least two of the following materials: aluminum oxide ($Al_2O_3$), germanium (Ge), silicon (Si), silicon oxide (SiO), silicon dioxide ($SiO_2$), titanium dioxide ($TiO_2$), tantalum pentoxide ($Ta_2O_5$), magnesium fluoride ($MgF_2$), silver (Ag) and aluminium (Al).

The use of the quoted materials for the production of thin film filters on semiconductor bodies has proved particularly suitable for mechanical, thermal and optical adaptability.

It is also novel that the filters are absorption filters, which can consist of inorganic and/or organic substances. The application of absorption filters to semiconductor surfaces is generally extremely simple compared with the application of corresponding thin film filters wherein it is necessary to deposit extremely small layer thicknesses homogeneously over the entire semiconductor surface. Absorption filters can frequently be applied in the form of lacquer layers to the surface to be provided with filters.

It is also novel that the filters for the photo-detector consist of a combination of different types of filters.

The application of different types of filter to a semiconductor surface which is to be provided with layers is generally a desirable method of producing filters since cooperation between different types of filters frequently produces the optimum effect.

It is also novel that the filters consist of a combination of thin film filters and absorption filters. Although thin film filters generally allow a relatively narrow-band light beam to be filtered out, usually it is impossible to achieve sufficient elimination of all the other wavelengths. However, this elimination can be attained by the additional use of suitable absorption filters.

It is also advantageous that the filters are edge filters. Frequently it is desirable to filter out specific groups of beams in such manner that their absorption profile exhibits an approximately rectangular shape. For this purpose, thin film filters and absorption filters with absorption profiles as steep as possible can be combined in such a way that the resultant radiation exhibits as rectangular as possible an absorption profile.

It is also novel that the filters are deposited on the detector surface by means of vapor deposition, sputtering, pyrolytic deposition, sedimentation from a suspension, or application of lacquers, particularly by centrifuging.

Of the aforementioned methods, vacuum deposition in particular is extremely widespread. It allows the production of substantially homogeneous layer thicknesses which can be varied by varying the vapor deposition time.

It is particularly advantageous that the filters are deposited onto the entire surface of a semiconductor wafer which is to be coated, and division into individual photo-detectors is subsequently carried out.

The coating of the entire surface of semiconductor wafers with filters corresponding to the invention, and the subsequent division of the semiconductor wafer into individual semiconductor crystals, constitutes a method of producing photo-detectors which is particularly economical with respect to labor time and costs.

BRIEF DESCRIPTION OF THE DRAWINGS

FIG. 1 is a cross-sectional view through a photo-detector of the invention with an absorption filter on a surface of the detector;

FIG. 2 is a cross-sectional view illustrating a Perot-Fabry interference filter on the silicon surface at part "A" of FIG. 1;

FIG. 3 shows a cross-sectional view illustrating a double Perot-Fabry interference filter on a silicon surface at part "A" of FIG. 1;

FIG. 4 illustrates curves representing the relative spectral sensitivity of Si-photodiodes equipped with filters and not equipped with filters; and FIG. 5 illustrates a cross-sectional view representing an edge filter on a silicon surface at part "A" of FIG. 1.

DECRIPTION OF THE PREFERRED EMBODIMENTS

FIG. 1 is a cross-section through a photo-detector 1 with a semiconductor body 2, which has a zone 3 of a first conductivity type, e.g. having a n-doping. Beneath the semiconductor surface 5, a further zone 4 of a second conductivity type opposite to the first, e.g. a p+-zone, is doped into the semiconductor body 2. A metal contact 6 is arranged on the semiconductor surface 5 in the region of the zone 4 for the current supply of the photo-detector 1. The remainder of the semiconductor surface 5 is covered with an optical filter 7 consisting e.g. of an absorption filter. Beneath the semiconductor surface 8, which lies opposite the semiconductor surface 5, a n+-doped zone 9 is provided in the n-doped semiconductor body 2. A continuous contact layer 10 is arranged on the semiconductor surface 8. The dash-dot circular line in FIG. 1 indicates part "A", which is represented in the other Figures in enlarged views and provided with different types of filters.

The doping, described in FIG. 1, of the photo-detector, p+/n/n+ can also be replaced by the reverse doping, n+/p/p+. In both cases blocked-free contacts are obtained. The filter arranged on the detector surface can represent any type of filter, e.g. absorption filter, interference filter, Perot-Fabry interference filter, double or multiple Perot-Fabry interference filter, and in particular a combination of different types of filters.

FIG. 2 shows part "A" from FIG. 1, with a Perot-Fabry interference filter on a silicon surface. The optical filter 7 on the semiconductor surface 5 of the silicon semiconductor body 2 consists of a silver layer 12 arranged directly on the semiconductor surface 5, a $SiO_2$ layer 13 arranged above the silver layer 12, and having a layer thickness of $\lambda/2$, where $\lambda$ is the peak wavelength of the spectral beam which is transmitted through the filter, and amounts to 405 nm, and finally consists of a further silver layer 14. In place of silver layers, it is also possible to employ e.g. aluminum layers or other reflective metal layers. A light beam oncoming in the direction of arrow 11 is split up into a transmitted beam, indicated by arrows 11a, and a reflected beam, indicated by arrows 11b. Multiple reflections take place within the optical filter 7 indicated by arrows 11c.

The layer thickness of the silver layers 12 and 14 are such that they produce 10% transmission for the wavelength 555 nm. The silver layers 12 and 14 can also be replaced by dielectric reflectors or by a high or low refraction $\lambda/4$ layer. In the example shown in FIG. 2, the silver layer 12 can be constructed as a $\lambda/4$ layer which consists of $SiO_2$ and is arranged on the semiconductor surface 5, and an overlying $\lambda/4$ layer consisting of silicon, whilst the silver layer 14 can be replaced by a $\lambda/4$ layer consisting of silicon. It is unnecessary to provide a further, low-refraction $\lambda/4$ layer on the last-mentioned silicon layer, if the medium adjoining the filter surfaces possesses a lower optical index of refraction than silicon, such as e.g. air. When metallic or dielectric reflectors are employed in the construction of Perot-Fabry interference filters, it should be noted that outside the transmitted spectral beam, metallic reflectors are virtually constantly reflective in a relatively wide spectral range. Dielectric reflectors, on the other hand, transmit specific spectral ranges with greater or lesser intensity, depending upon the wavelength, near the transmitted, spectral beam.

FIG. 3 illustrates part "A" from FIG. 1, with a double Perot-Fabry interference filter on a silicon surface. On the surface 5 of the silicon semiconductor body 2 the following layers are deposited in turn: a $\lambda/4$ $SiO_2$ layer 15, a $\lambda/4$ Si layer 16, a $\lambda/2$ $SiO_2$ layer 17, a $\lambda/4$ Si layer 18, a $\lambda/4$ $SiO_2$ layer 19, a $\lambda/4$ Si layer 20, a $\lambda/2$ $SiO_2$ layer 21 and a $\lambda/4$ Si layer 22, where $\lambda$ =950 nm (infrared range). A light beam approaching in the direction of the arrow 23 is split into a transmitted beam indicated by the arrows 24, and a reflected beam indicated by the arrows 25. Within the filter, multiple reflections occur along the arrows 27 and 28. The multiple reflections also involve a certain sub-transmissiveness in the path direction, e.g. indicated by the arrows 29, and a certain sub-transmissiveness in the direction of the reflected beam, e.g. indicated by the arrows 30.

The series connection of more than two Perot-Fabry filters allows the production of arbitrary multiple Perot-Fabry interference filters. The layer sequence of high-refraction and low-refraction $\lambda/4$ and $\lambda/2$ layers must not necessarily follow the above arrangement. It is also possible to reverse the described high-refraction and low-refraction layers, in which case the $\lambda/2$ layers are highly-refractive, and not low-refractive as in the quoted example, for the production of Perot-Fabry filters.

In FIG. 4, the curve 50 indicates the spectral sensitivity of a Si-photodiode, and the curve 51 illustrates the spectral sensitivity of a Si-photodiode which is provided with a filter as described in FIG. 3. The sensitivity range of the Si-photodiode provided with a filter is thus matched to the emission range of a GaAS-diode, a luminescence diode, having an emission maximum at 950 nm (infrared range).

FIG. 5 illustrates part "A" from FIG. 1, with a notch filter on a silicon surface. On the surface 5 of a silicon semiconductor 2, the following layers having a layer thickness of λ/4 are arranged in turn: a low-refraction SiO$_2$ layer 31, a high-refraction silicon layer 32, a low-refraction SiO$_2$ layer 33, a high-refraction silicon layer 34, a low-refraction SiO$_2$ layer 35, a high-refraction Si layer 36, a low-refraction SiO$_2$ layer 37, and a high-refraction Si layer 38. A light beam approaching in the direction of the arrow 39 is split into a reflected beam in the direction of the arrows 40 and a transmitted beam in the direction of the arrow 41. A filter of this type virtually forms an edge filter, whose path edge exhibits the wave value λ, which is calculated from 4 times the layer thickness of one individual filter layer.

According to the invention, the photo-detectors employ combinations of different types of filters, always with the aim of optimizing the desired effect. The optimization produces a maximum permeability to optical radiation in the operating range of the photodetector, and at the same time a minimum permeability to optical radiation lying within the sensitivity range of the corresponding photodetector, but outside the operating range of the associated detector.

The filters corresponding to the invention can be used to coat different photo-detectors, in particular photo-resistors or photo-diodes.

Although various minor modifications may be suggested by those versed in the art, it should be understood that we wish to embody within the scope of the patent warranted hereon, all such embodiments as reasonably and properly come within the scope of our contribution to the art.

We claim as our invention:

1. A photo-detector for sensing light in a narrow spectral range, comprising:
   a semiconductor body of first conductivity type having a region of second conductivity type doped into the semiconductor body at a major surface;
   a metal contact connected to said region of second conductivity type;
   at least one filtering layer means directly adhering to the major surface of the semiconductor body and covering at least a portion of said region of second conductivity type, said layer means being permeable to a narrow spectral range of electromagnetic radiation and impermeable to adjacent spectral ranges; and
   said filtering layer means comprising a Perot-Fabry filter consisting of alternating silicon and silicondioxide layers, one of said alternating layers being in direct contact with the major surface.

2. A filtered photo-detector comprising: a photodetector having a light receiving surface; and a filter means comprising at least one layer directly applied to the receiving surface and a metal contact arranged on the semiconductor surface and passing through the filter means, said filter means being permeable to a spectral range of electromagnetic radiation including an infrared wavelength which lies in an operating range of the photo-detector, said filter means being largely impermeable to other spectral ranges, and said filter means comprising a Perot-Fabry interference filter means having alternating layers of silicon (Si) and Silicon dioxide (SiO$_2$).

3. A photo-detector as claimed in claim 2 in which said filter means comprises double Perot-Fabry filters.

4. A photo-detector as claimed in claim 2 in which said filter means comprises multiple Perot-Fabry filters.

5. A photo-detector as claimed in claim 2 in which said filter means includes an additional absorption filter.

6. A photo-detector as claimed in claim 5 in which the absorption filter comprises inorganic substances.

7. A photo-detector as claimed in claim 5 in which the absorption filter comprises organic substances.

8. A photo-detector as claimed in claim 5 in which said filter means comprises an edge filter.

9. A photo-detector as claimed in claim 2 in which said filter means comprises an edge filter.

10. A photo-detector as claimed in claim 2 in which said filter means is deposited on an entire surface of a semiconductor wafer and the wafer is divided into individual photo-detectors.

11. A photo-detector as claimed in claim 2 in which said filter means operating range includes a wavelength of approximately 950 nm.

12. A photo-detector as claimed in claim 2 in which the Perot-Fabry filter means includes only silicon and silicon dioxide layers.

13. A photo-detector as claimed in claim 2 in which one of said silicon and silicon dioxide layers is in direct contact with the receiving surface.

* * * * *